US008787029B2

(12) United States Patent
Yang et al.

(10) Patent No.: US 8,787,029 B2
(45) Date of Patent: Jul. 22, 2014

(54) BUTTON MODULE AND ELECTRONIC DEVICE

(75) Inventors: Nai-Lin Yang, New Taipei (TW); Xiao-Meng Zhou, Shenzhen (CN); Jun-Bo Du, Shenzhen (CN); Wei Gong, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 191 days.

(21) Appl. No.: 13/331,723

(22) Filed: Dec. 20, 2011

(65) Prior Publication Data

US 2013/0033828 A1 Feb. 7, 2013

(30) Foreign Application Priority Data

Aug. 4, 2011 (CN) .......................... 2011 1 0222458

(51) Int. Cl.

| | |
|---|---|
| ***H05K 5/00*** | (2006.01) |
| ***H05K 7/00*** | (2006.01) |
| ***H05K 7/14*** | (2006.01) |
| ***H05K 7/18*** | (2006.01) |
| ***H01H 13/70*** | (2006.01) |
| ***H01H 3/12*** | (2006.01) |
| ***H01H 13/14*** | (2006.01) |
| ***H04M 1/00*** | (2006.01) |

(52) U.S. Cl.
USPC ...... 361/781; 361/798; 361/679.01; 200/343; 200/341; 455/575.1

(58) Field of Classification Search
USPC ............. 361/798, 679.01, 781; 200/343, 341; 455/575.1, 575.3
See application file for complete search history.

(56) References Cited

U.S. PATENT DOCUMENTS

| | | | | |
|---|---|---|---|---|
| 7,348,511 | B2 * | 3/2008 | Chen et al. | 200/296 |
| 2006/0183516 | A1 * | 8/2006 | Ham | 455/575.3 |
| 2010/0039299 | A1 * | 2/2010 | Yang et al. | 341/22 |
| 2010/0219057 | A1 * | 9/2010 | Okuzumi | 200/5 A |

* cited by examiner

*Primary Examiner* — Anthony Haughton
*Assistant Examiner* — Zhengfu Feng
(74) *Attorney, Agent, or Firm* — Novak Druce Connolly Bove + Quigg LLP

(57) ABSTRACT

A button module includes a body, a switch fixed to the body, a light member electrically connected to the switch, a button located opposite to the light member and an elastic member. The elastic member comprising a pressing portion, a fixing end extended from one end of the pressing portion and a fastening end extending from the opposite end of the pressing portion. The pressing portion is contacted with the switch, the fixing end is fixed to the body, the fastening end is fastened to the button, the light member lights the button when pressing the button to drive the pressing portion to trigger the switch.

11 Claims, 4 Drawing Sheets

BUTTON MODULE AND ELECTRONIC DEVICE

BACKGROUND

1. Technical Field

The disclosure generally relates to button modules and electronic devices using the button modules.

2. Description of the Related Art

Electronic devices (e.g. mobile phone) may include a switch and a button for triggering the switch. The electronic device further includes an elastic gasket clamped between the switch and the button, facilitating the pressing and restoring of the button. However, it is difficult to clamp the elastic gasket between the switch and the button, and the pressing of the button can be uncomfortable.

Therefore, there is room for improvement within the art.

BRIEF DESCRIPTION OF THE DRAWINGS

Many aspects of the exemplary button module and electronic device can be better understood with reference to the following drawings. The components in the various drawings are not necessarily drawn to scale, the emphasis instead being placed upon clearly illustrating the principles of the exemplary button module and electronic device. Moreover, in the drawings, like reference numerals designate corresponding parts throughout the diagrams.

DETAILED DESCRIPTION

Figure 1:
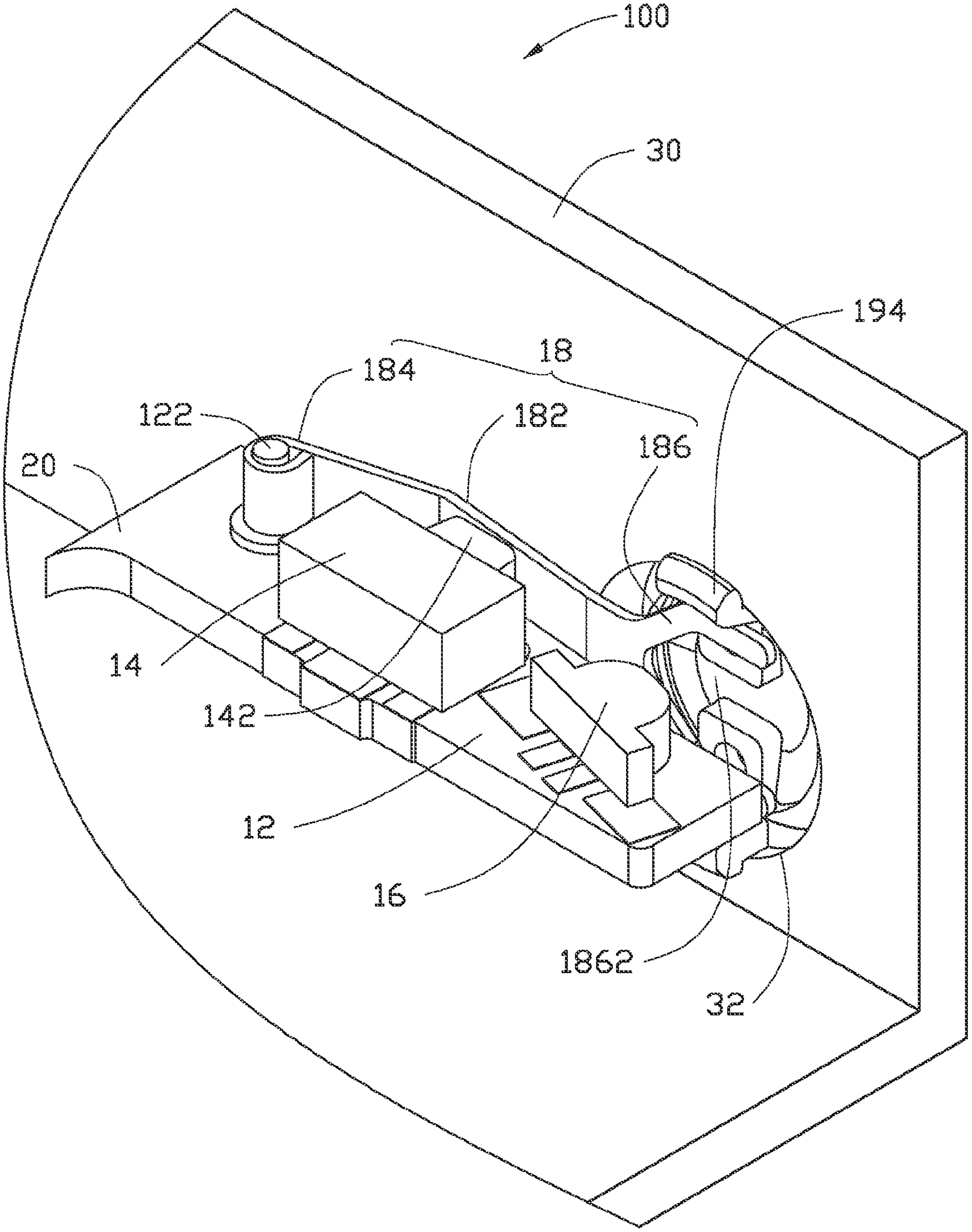
FIG. 1 is an isometric view of an electronic device to an exemplary embodiment.
Figure 2:
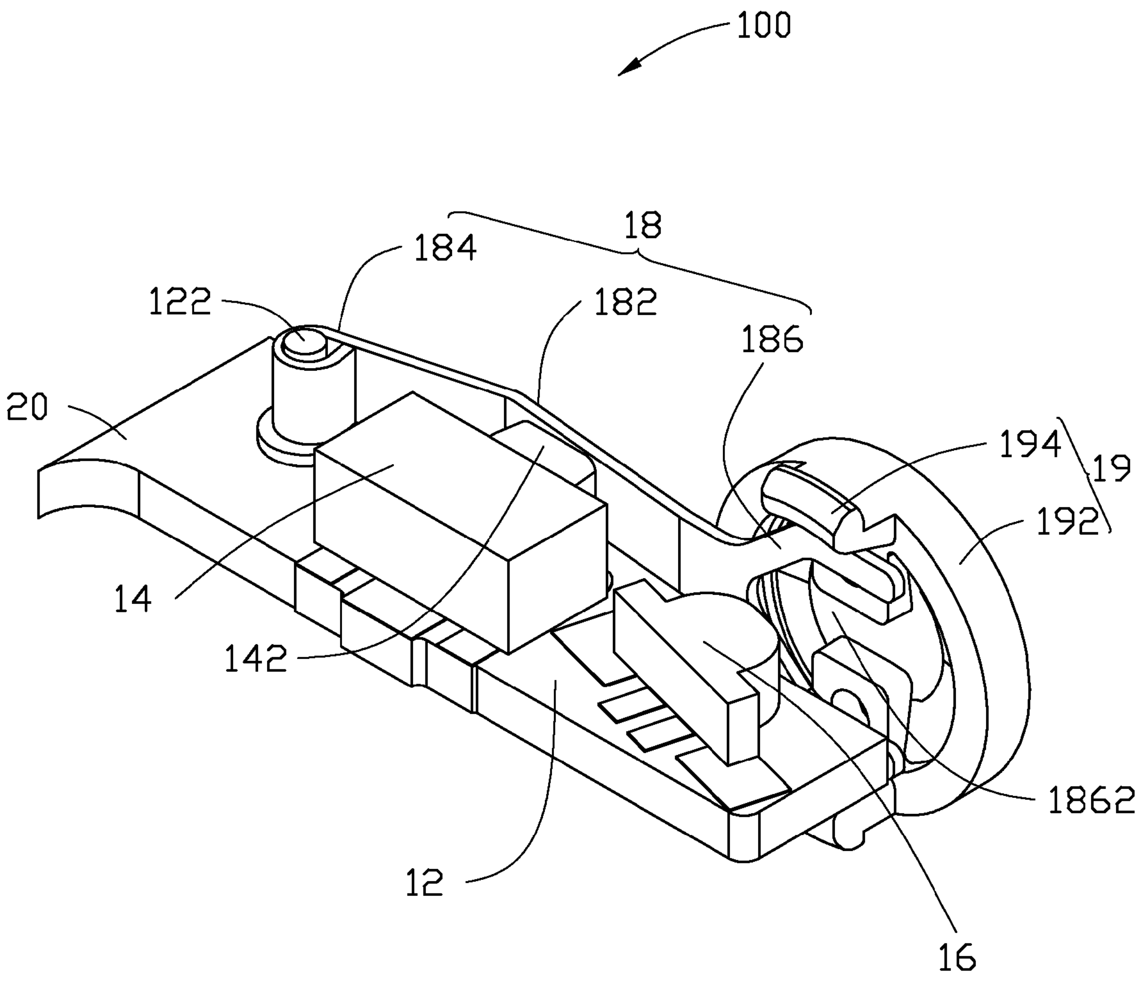
FIG. 2 is an exploded view of the button module of the electronic device shown in FIG. 1.

FIGS. 1 and 2 show an exemplary electronic device 100 (e.g. mobile phone) including a button module 10 (referring to FIG. 3), a Printed Circuit Board (PCB) 20 and a housing 30. The button module 10 includes a body 12, a switch 14, a light member (e.g. LED light) 16, an elastic member 18, and a button 19.

Figure 3:
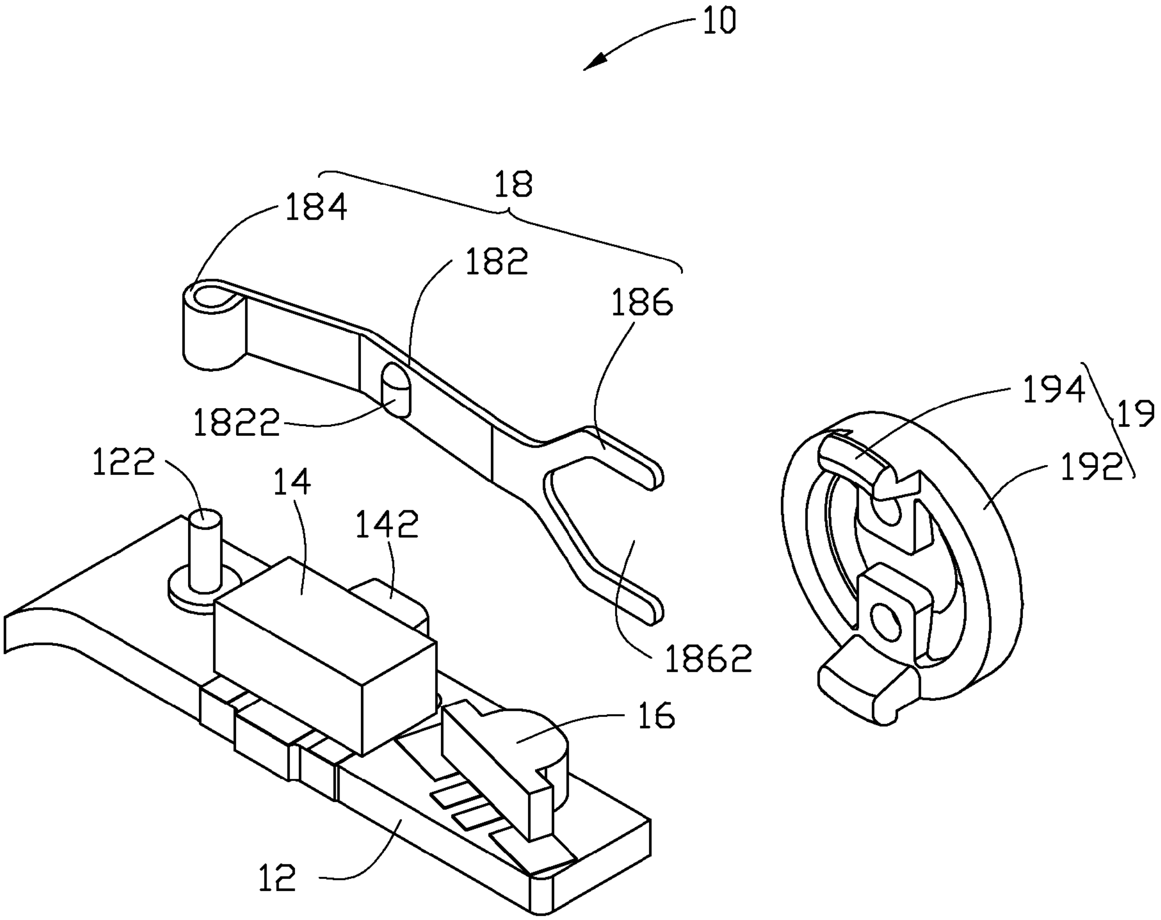
FIG. 3 is an exploded view of the button module shown in FIG. 2.
Figure 4:
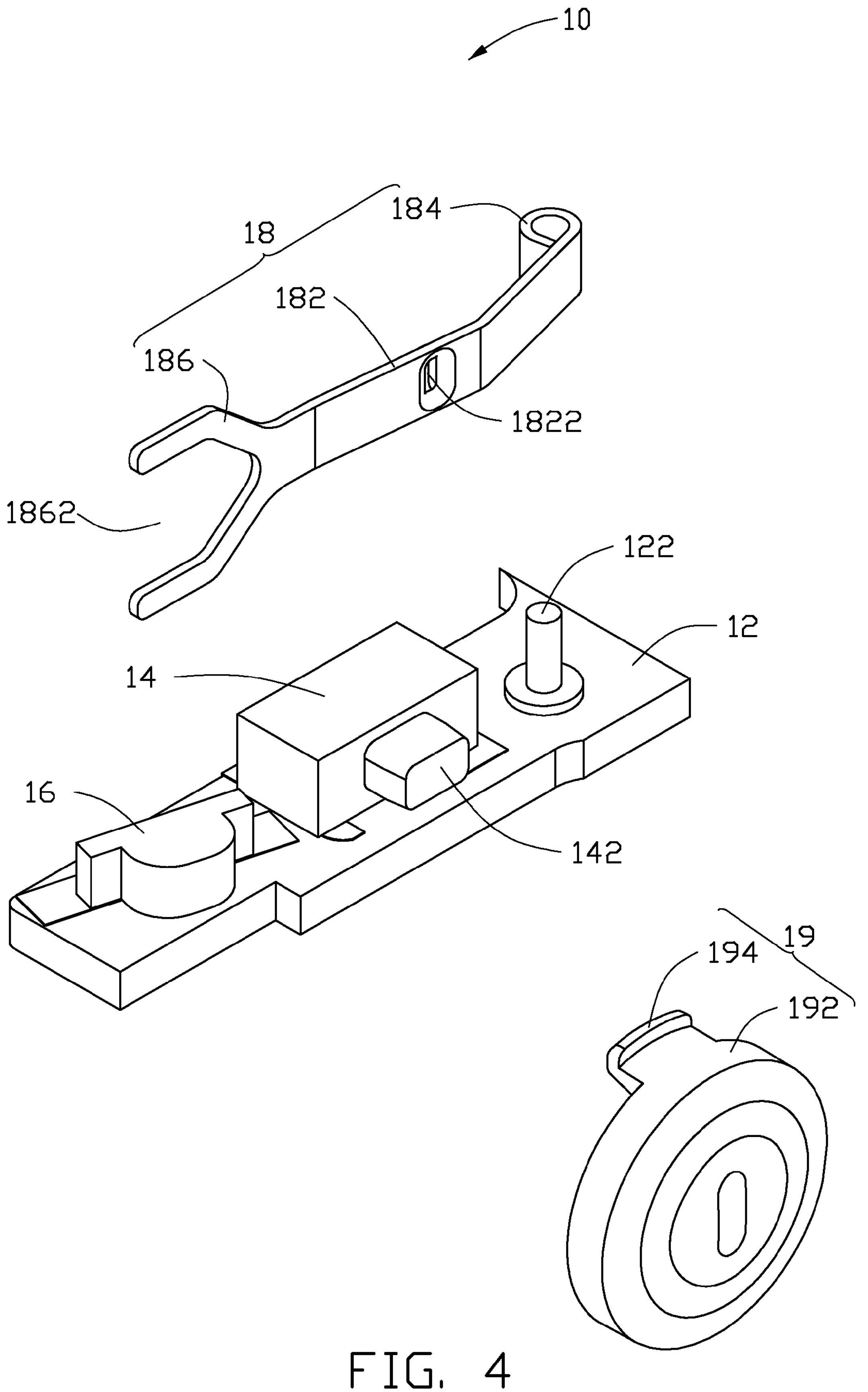
FIG. 4 is another isometric view of the button module shown in FIG. 2.

FIGS. 3 and 4, in this embodiment, the body 12 can be a portion of the PCB 20. Both the switch 14 and the light member 16 are electrically connected and fixed to the body 12. The body 12 has a protruding fixing pin 122. The fixing pin 122 fixes the elastic member 18 to the body 12.

In this exemplary embodiment, the switch 14 is triggered to turn on or off the power, and has a pressed portion 142. When the pressed portion 142 of the switch 14 is pressed, the power of the electronic device 100 is turned on and the light member 16 correspondingly illuminates light.

The elastic member 18 includes a pressing portion 182, a fixing end 184 and a fastening end 186. The fixing end 184 extends from one end of the pressing portion 182. The fastening end 186 extends from another end of the pressing portion 182 opposite to the fixing end 184. The pressing portion 182 defines a protruding point 1822 contacting to the switch 14. The fixing end 184 is fixed on the fixing pin 122. The fastening end 186 is fastened to the button 19. The fastening end 186 has two branch sections and defines a channel 1862 between the two branch sections opposite to the light member 16. The channel 1862 guides the light from the light member 16 to illuminate the button 16.

The button 19 may be made from transparent or semitransparent materials. The button 19 includes a button body 192 and two opposite latches 194 projecting from the button body 192. The housing 30 defines a mounting hole 32. The latches 194 are latched in the mounting hole 32.

In assembly, the switch 14 and the light member 16 are soldered on the body 12 to enable the switch 14 to be positioned between the fixing pin 122 and the light member 16. The fixing end 184 of the elastic member 18 is fixed to the fixing pin 122. The latches 194 of the button 19 are pressed into the mounting hole 32 of the housing 30 until the latches 194 latch to the housing 30. At this time, the fastening end 186 is positioned between the latches 194 and resists against the button body 192. In this case, the assembly of the electronic device 100 is completed.

In use, an external pressing force may be applied on the button 19, driving the elastic member 18 to deform towards the light member 16. In this time, the elastic member 18 drives the protruding point 1822 to trigger the switch 14, and the elastic member 18 accumulates an elastic force. When the switch 14 has been triggered, the power of the electronic device is turned on or off, and at the same time the light member 16 lights and the light produced by the light member 16 illuminates the outside of the electronic device 100 through the button 19. The elastic member 18 and the triggering point 1822 can return to their original positions by releasing of the elastic force of the elastic member 18.

It is to be understood, however, that even through numerous characteristics and advantages of the exemplary disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A button module, comprising:

a body, the body having a first body end, a second body end, and an intermediate body portion between the first body end and the second body end;

a fixing pin projecting from the body adjacent to the first body end;

a light member fixed to the body adjacent to the second body end;

a switch fixed to the body in the intermediate body portion and electrically connected to the light member, axes of the light member and the switch being oblique relative to each other;

a button located opposite to the light member, the button including a button body and two opposite latches projecting from the button body; and an elastic member made of a single v-shaped sheet, the elastic member having a first member end, a second member end, and an intermediate member portion between the first member end and the second member end; the first member end comprising a fixing end rotatably mounted to the fixing pin, the intermediate member portion comprising a pressing portion for pressing against the switch, the second member end having two branch sections, each branch section for attachment to the one of the latches projecting from the button body; such that pressing the button causes the elastic member to rotate about the fixing pin and the intermediate member portion contacts and activates the switch, and the light member lighting the button.

2. The button module as claimed in claim 1, wherein a fastening end defines a channel between the two branch sections, the light member lights the button through the channel.

3. The button module as claimed in claim 1, wherein the button is made from transparent material.

4. The button module as claimed in claim 1, wherein the button is made from semitransparent material,

5. The button module as claimed in claim 1, wherein the pressing portion defines a protruding point, the protruding point is contacted to the switch.

6. An electronic device, comprising:

a housing;

a PCB mounted in the housing, the PCB having a body, the body having a first body end, a second body end, and an intermediate body portion between the first body end and the second body end;

a fixing pin projecting from the body adjacent to the first body end;

a light member fixed to the body adjacent to the second body end;

a switch fixed to the body of the PCB in the intermediate body portion and electrically connected to the light member, axes of the light member and the switch being oblique relative to each other;

a button mounted on the housing and located opposite to the light member, the button including a button body and two opposite latches projecting from the button body; and an elastic member made of a single v-shaped sheet, the elastic member having a first member end, a second member end, and an intermediate member portion between the first member end and the second member end; the first member end comprising a fixing end rotatably mounted to the fixing pin, the intermediate member portion comprising a pressing portion for pressing against the switch, the second member end having two branch sections, each branch section for attachment to the one of the latches projecting from the button body; such that pressing the button causes the elastic member to rotate about the fixing pin and the intermediate member portion contacts and activates the switch, and the light member lighting the button.

7. The electronic device as claimed in claim 6, wherein a fastening end defines a channel between the two branch sections, the light member lights the button through the channel.

8. The electronic device as claimed in claim 6, wherein the button is made from transparent material.

9. The electronic device as claimed in claim 6, wherein the button is made from semitransparent material.

10. The electronic device as claimed in claim 6, wherein the housing defines a mounting hole, the button is mounted in the mounting hole.

11. The electronic device as claimed in claim 6, wherein the pressing portion defines a protruding point, the protruding point is contacted to the switch.

* * * * *